(12) United States Patent
Yang

(10) Patent No.: US 7,938,092 B2
(45) Date of Patent: May 10, 2011

(54) COMBUSTION AND EMERGENCY STARTING CONTROL SYSTEM WITH AUXILIARY POWER

(76) Inventor: Tai-Her Yang, Dzan-Hwa (TW)

(*) Notice: Subject to any disclaimer, the term of this patent is extended or adjusted under 35 U.S.C. 154(b) by 0 days.

(21) Appl. No.: 12/457,715

(22) Filed: Jun. 19, 2009

(65) Prior Publication Data
US 2010/0319646 A1    Dec. 23, 2010

(51) Int. Cl.
*F02P 3/00* (2006.01)
*F02N 11/08* (2006.01)

(52) U.S. Cl. ............ 123/179.28; 123/179.5; 123/179.7; 123/605; 123/655; 123/656

(58) Field of Classification Search .......... 123/601, 123/605, 618, 620, 491, 179.3, 179.5, 179.7, 123/179.14, 179.24, 179.28, 179.25; 701/113; 73/114.58, 114.59
See application file for complete search history.

(56) References Cited

U.S. PATENT DOCUMENTS

| | | | | |
|---|---|---|---|---|
| 2,075,431 A * | 3/1937 | Du Laney | | 123/620 |
| 2,521,969 A * | 9/1950 | Dugan | | 290/37 R |
| 2,529,921 A * | 11/1950 | Davolt | | 123/179.3 |
| 3,516,396 A * | 6/1970 | Lawson, Jr. | | 123/648 |
| 3,560,833 A * | 2/1971 | Kazuo et al. | | 363/18 |
| 5,325,042 A * | 6/1994 | Murugan | | 322/10 |
| 2006/0066270 A1* | 3/2006 | Kumagai et al. | | 318/139 |
| 2010/0109588 A1* | 5/2010 | Koike | | 318/400.21 |

FOREIGN PATENT DOCUMENTS
JP    2000-102177    *  4/2000
* cited by examiner

*Primary Examiner* — Hai H Huynh
(74) *Attorney, Agent, or Firm* — Bacon & Thomas, PLLC

(57) ABSTRACT

The present invention is an installation of an emergency starting switching device and/or direct current boosted boost circuit device. When the power of the starting battery is insufficient, the electric energy of the auxiliary battery is used to drive the starting motor in order to start the engine by operating the emergency starting switching device. And when the engine is started, the voltage of the ignition device or the fuel injection device is stepped up to strengthen its starting capability by means of a voltage boost by the direct current boosted boost circuit device.

5 Claims, 5 Drawing Sheets

COMBUSTION AND EMERGENCY STARTING CONTROL SYSTEM WITH AUXILIARY POWER

BACKGROUND OF THE INVENTION (a) Field of the Invention

The present invention relates to a combustion and emergency starting control system with auxiliary power that relies on the installation of an auxiliary power storage device that exclusively supplies the required electric energy to the ignition device or fuel injection device and for emergency starts, and on the installation of isolation diode to isolate battery power for starting motor, in order to prevent the sudden drop of the voltage of the ignition device or the fuel injection device that can hinder normal engine start due to the substantial drop of battery voltage as a result of the greater current required in starting motor when the engine is started while ensuring excellent ignition. Furthermore, the system is equipped with emergency starting switch device 500 and/or direct current boosted boost circuit device 600 so that when starting battery power is insufficient during starting, the electric energy of the auxiliary battery can drive the starting motor in order to start the engine by means of operating the emergency starting switching device; and that the voltage boost of the direct current boosted boost circuit device 600 will enable the ignition device or the fuel injection device to step up voltage in order to strengthen its starting capability when the motor is started to start the engine.

Furthermore, for application on manually started engine that are not installed with starting motor and starting battery, the installation of a direct current boosted boost circuit device 600 can provide normal working voltage and obtain excellent combustion at the starting stage when engine speed is relatively low and generator voltage is insufficient.

(b) Description of the Prior Art

Traditional engine ignition or fuel injection system normally shares common battery power with the engine starting motor. Therefore, when the engine is started, the battery voltage drops (normally drops by 25-40%) due to the motor's high starting current. This causes poor ignition or the slowing down of the fuel injection device switch speed which in turn makes it hard to start the engine. Moreover, when the power of the starting battery is insufficient, external power is needed for relief. Not only is this inefficient but also inconvenient.

SUMMARY OF THE INVENTION

The present invention relates to a combustion and emergency starting control system with auxiliary power that relies on the installation of an auxiliary power storage device that exclusively supplies the required electric energy to the ignition device or fuel injection device and for emergency starts, and on the installation of isolation diode to isolate battery power for starting motor, in order to prevent the sudden drop of the voltage of the ignition device or the fuel injection device that can hinder normal engine start due to the substantial drop of battery voltage as a result of the greater current required in starting motor when the engine is started while ensuring excellent ignition. Furthermore, the system is equipped with emergency starting switch device 500 and/or direct current boosted boost circuit device 600 so that when starting battery power is insufficient during starting, the electric energy of the auxiliary battery can drive the starting motor in order to start the engine by means of operating the emergency starting switching device; and that the voltage boost of the direct current boosted boost circuit device 600 will enable the ignition device or the fuel injection device to step up voltage in order to strengthen its starting capability when the motor is started to start the engine.

Furthermore, for application on manually started engine that are not installed with starting motor and starting battery, the installation of a direct current boosted boost circuit device 600 can provide normal working voltage and ensure excellent ignition at the starting stage when engine speed is relatively low and generator voltage is insufficient.

DESCRIPTION OF MAIN COMPONENT SYMBOLS

Figure 1:
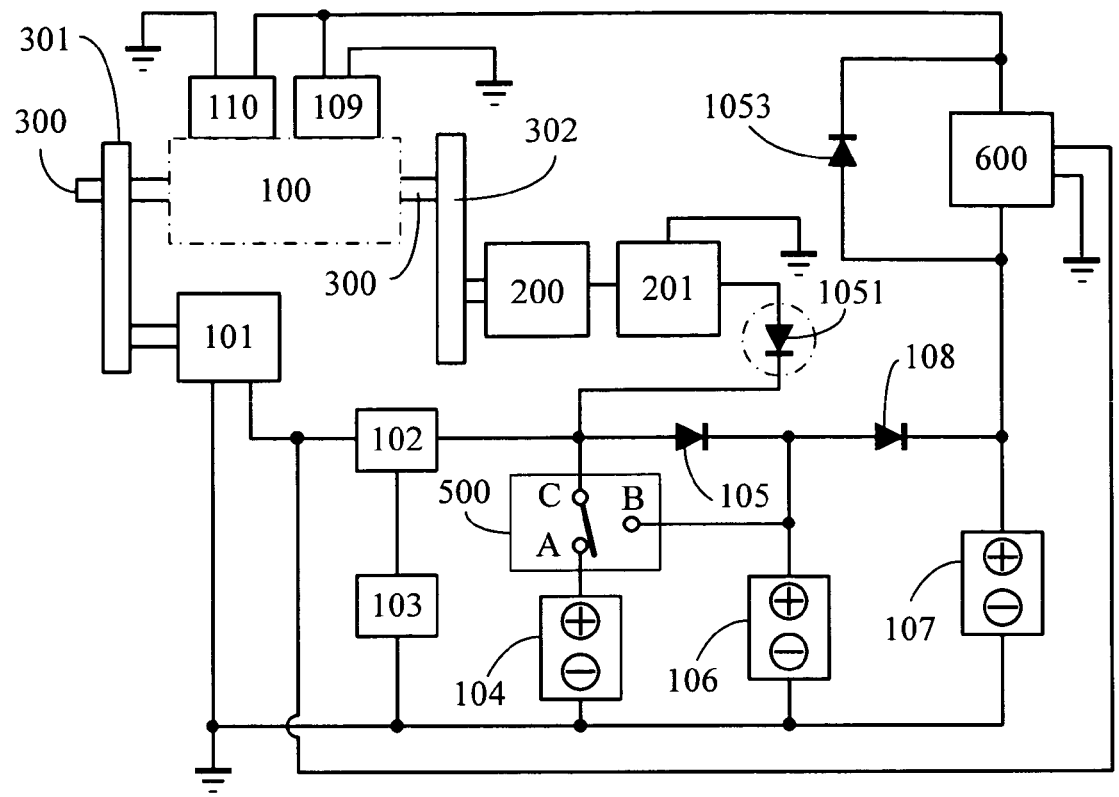
FIG. 1 is a circuit block diagram of a combustion and emergency starting control system with auxiliary power

100: Engine set
101: Starting motor
102: Relay
103: Starting switch
104: Starting battery
105: Isolation diode
106: Primary charging and discharging auxiliary power storage device
107: Secondary charging and discharging auxiliary power storage device
108: Isolation diode
109: Engine ignition device
110: Fuel injection device
200: Generator
201: Regulating device
211: Generator winding
300: Engine rotating shaft
301, 302: Transmission device
500: Emergency starting switching device
600: Direct current boosted boost circuit device
1051, 1053: Diodes

DETAILED DESCRIPTION OF THE PREFERRED EMBODIMENTS

The present invention relates to a combustion and emergency starting control system with auxiliary power that relies on the installation of an auxiliary power storage device that exclusively supplies the required electric energy to the ignition device or fuel injection device and for emergency starts, and on the installation of isolation diode to isolate battery power for starting motor, in order to prevent the sudden drop of the voltage of the ignition device or the fuel injection device that can hinder normal engine start due to the substantial drop of battery voltage as a result of the greater current required in starting motor when the engine is started while ensuring excellent ignition. Furthermore, the system is equipped with emergency starting switch device 500 and/or direct current boosted boost circuit device 600 so that when starting battery power is insufficient during starting, the electric energy of the auxiliary battery can drive the starting motor in order to start the engine by means of operating the emergency starting switching device; and that the voltage boost of the direct current boosted boost circuit device 600 will enable the ignition device or the fuel injection device to step up voltage in order to strengthen its starting capability when the motor is started to start the engine.

Furthermore, for application on manually started engine that are not installed with starting motor and starting battery, the installation of a direct current boosted boost circuit device 600 can provide normal working voltage and ensure excellent ignition at the starting stage when engine speed is relatively low and generator voltage is insufficient.

As shown in FIG. 1, a combustion and emergency starting control system with auxiliary power that relies on the installation of an auxiliary power storage device that exclusively supplies the required electric energy to the engine ignition device and/or fuel injection device and for emergency starts, and on the installation of isolation diode to isolate the starting battery of the motor, and on the installation of emergency starting switching device 500 and/or direct current boosted boost circuit device 600. Its main components include:

Engine set 100: Consists of internal combustion engine using diesel, biodiesel, gasoline, natural gas or methanol as fuel and equipped with a starting motor 101;

Engine rotating shaft 300: Supply rotating kinetic energy engine output to drive loads, and to couple with the starting motor 101 by means of the transmission device 301, directly or by means of the transmission device 302 to couple with the generator set 200;

Starting motor 101: Consists of brush or brushless direct current or alternating current motors or generators with motor capability. By operating the motor start relay 102, the battery electric energy is controlled to drive the starting motor 101, directly or through the transmission device 301 affecting the generator set 100;

Starting switch 103: Consists of electromechanical switching elements or solid state electronic switching elements to supply and control power from starting battery 104 to the ignition device or the ignition device and/or the fuel injection device 110; and/or to supply power and control motor starting relay 102; or to directly supply power and control staring motor 101; and/or to supply power to other car electrical devices;

Starting battery 104: Consists of various charging and discharging secondary batteries or super capacitance to provide electric energy to the starting motor 101, and to accept power charging from the generated electric energy of the generator 200 and external sources;

Isolation diode 105: Consists of diodes and installed between starting battery 104 and the primary charging and discharging auxiliary power storage device 106 to become one way turn-on for starting battery 104 current to charge the primary charging and discharging auxiliary power storage device 106. Moreover, the isolation diode 105 is relied upon to prevent reverse discharging to the starting battery 104;

Primary charging and discharging auxiliary power storage device 106: Consists of various charging and discharging batteries or super capacitance to store electric energy from the starting motor 104, built-in generator 200 or from other external charging devices;

Secondary charging and discharging auxiliary power storage device 107: Consists of a secondary charging and discharging battery or super capacitance to store electrical energy from the primary charging and discharging auxiliary power storage device 106 in order to supply instant electric energy to the engine ignition device 109 during engine ignition;

Isolation diode 108: Located between the primary charging and discharging auxiliary power storage device 106 and the secondary charging and discharging auxiliary power storage device 107, and the current direction from the primary charging and discharging auxiliary power storage device 106 to the secondary charging and discharging auxiliary power storage device 107 is in series with the isolation diode 108 in order to prevent reverse discharge by the secondary charging and discharging auxiliary power storage device 107 on the primary charging and discharging device 106 when using the primary charging and discharging auxiliary power storage device 106 as the power source in starting the motor in an emergency while operating the emergency starting switching device 500;

Generator 200: Consists of alternating current or direct current generator and driven directly or indirectly through transmission device 302 by an engine to produce a relative alternating electric energy or a rectified direct current or to directly produce direct current electric energy output; when generator 200 and/or regulating device 201 are direct current generators and do not possess reverse current avoidance function, isolation is made according to the charging current direction from the generator winding 211 to the starting battery 104 through the regulating device 201 and by the forward series installation of diode 1051, and if generator 200 possesses reverse current avoidance function, then installing diode 1051 is unnecessary;

Regulating device 201: Consists of electromechanical or solid state electronic type circuit device; when generator 200 works as a direct current generator, the regulating device directly regulates the direct current electric energy and separately charges the starting battery 104, and/or the primary charging and discharging auxiliary power storage device 106, and/or secondary charging and discharging auxiliary power storage device 107, and/or to supply power to other loads, and when generator 200 works as an alternating current generator, the alternating current must first be rectified into direct current and then passed through regulating device 201 before it can charge the starting battery 104, and/or primary charging and discharging auxiliary power storage device 106, and/or secondary charging and discharging auxiliary power storage device 107, and/or to supply power to other loads;

Engine ignition device 109: Consists of electromechanical circuit elements or solid state electronic circuit elements or the combination of both elements to provide ignition to an internal combustion engine for running the engine;

Fuel injection device 110: Consists of a fuel injection structural device with throttle switching function to control injection width, and circuit control devices for operating fuel injection structural devices that are able to refer to throttle opening, oil temperature, air intake temperature, and oxygen-containing crankshaft signals (IP-ARB);

Any one or both of the engine ignition device 109 and the fuel injection device 110 are installed.

Any one or both of the emergency starting switching device 500 and the direct current boosted boost circuit device 600 are installed. These include:

Emergency starting switching device 500: Consists of three-terminal type solid state electronic switching device or mechanical switching device, and the common C terminal is the positive power terminal leading to the motor starting relay 102 and starting switch 103, and the normally closed A terminal is the positive terminal leading to the starting battery 104, and the normally opened B terminal which is switch able to closed during an emergency is the positive terminal leading to the primary charging and discharging auxiliary power storage device 106; when battery starting power is insufficient, operating the auxiliary switching device can enable the auxiliary battery electric energy to drive and start the motor which in turn will start the engine.

Direct current boosted boost device 600: Consists of solid state electronic circuit elements or electromechanical circuit elements installed between the power mains of the secondary charging and discharging auxiliary power storage device 107 and the power mains of the engine ignition device 109 and the fuel injection device 110, and the direct current boosted boost circuit device 600 is started by the signal from the relay 102 when the motor power is turned on to increase voltage in order to enable the engine ignition device 109 or the fuel injection device 110 to run on a booster state advantageous to starting the engine and the diode 1053 is connected in parallel between the power input terminal of the direct current boosted boost circuit device 600 and the higher homopolar voltage output terminal; when the direct current boosted boost circuit device 600 stops operating, electric energy from the power terminal are delivered through the diode 1053 to the engine ignition device 109 and the fuel injection device 110.

During the application of the combustion and emergency starting control system with auxiliary power, the primary charging and discharging auxiliary power storage device 106 can select elements with a higher energy density while the secondary charging and discharging auxiliary power storage device 107 can select elements with a higher power density to match ignition quality and economy.

As described in FIG. 1, the engine ignition device 109, fuel injection device 110, starting battery 104, isolation diode 105, primary charging and discharging auxiliary power storage device 106, isolation diode 108, secondary charging and discharging auxiliary power storage device 107, emergency starting switching device 500, generator 200, regulating device 201, direct current boosted boost circuit device 600 are separately installed or combined by two or more of the aforementioned components.

Figure 2:
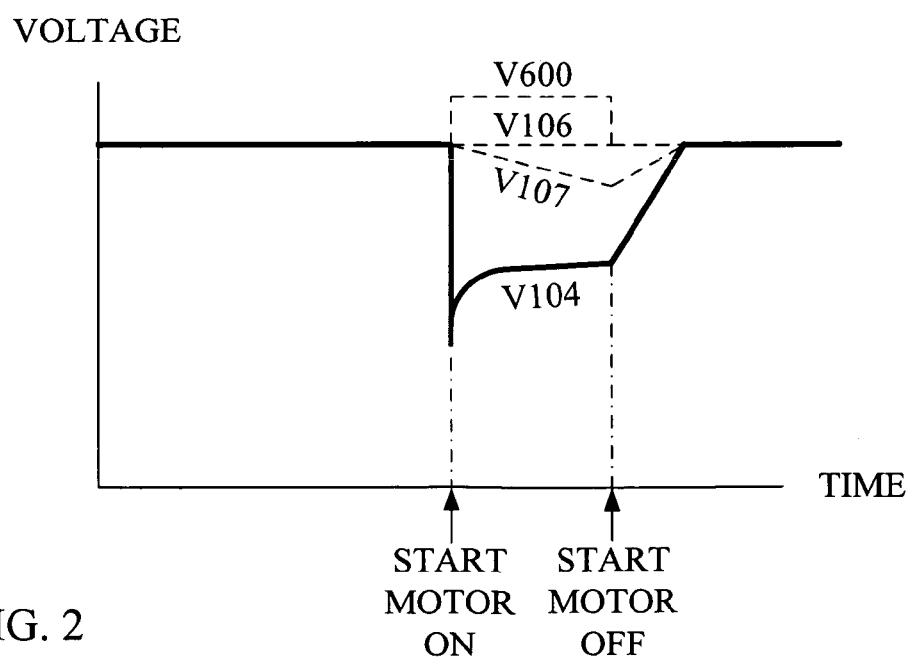
FIG. 2 is an operational diagram showing the variation of battery voltage and motor starting voltage in FIG. 1

FIG. 2 is an operational diagram showing the variation of the battery voltage and the motor start voltage in FIG. 1. As shown in FIG. 2, the voltage V106 is the terminal voltage of the primary charging and discharging auxiliary power storage device 106, and Voltage V107 is the terminal voltage of the secondary charging and discharging auxiliary power storage device 107, and V104 is the terminal voltage of the starting motor 104, and V600 is the output voltage of the direct current boosted boost circuit device 600.

Figure 3:
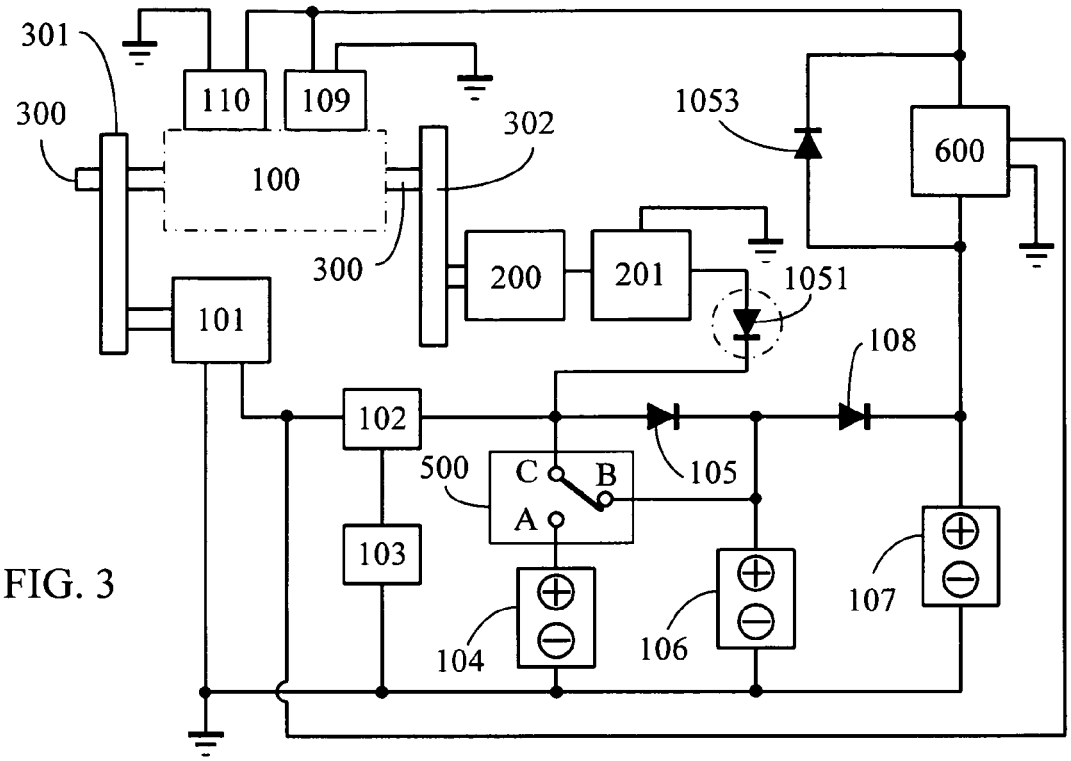
FIG. 3 is a circuit diagram of the auxiliary power electric energy starting the engine in FIG. 1

FIG. 3 is a circuit diagram of the auxiliary power electric energy starting the engine in FIG. 1.

Figure 4:
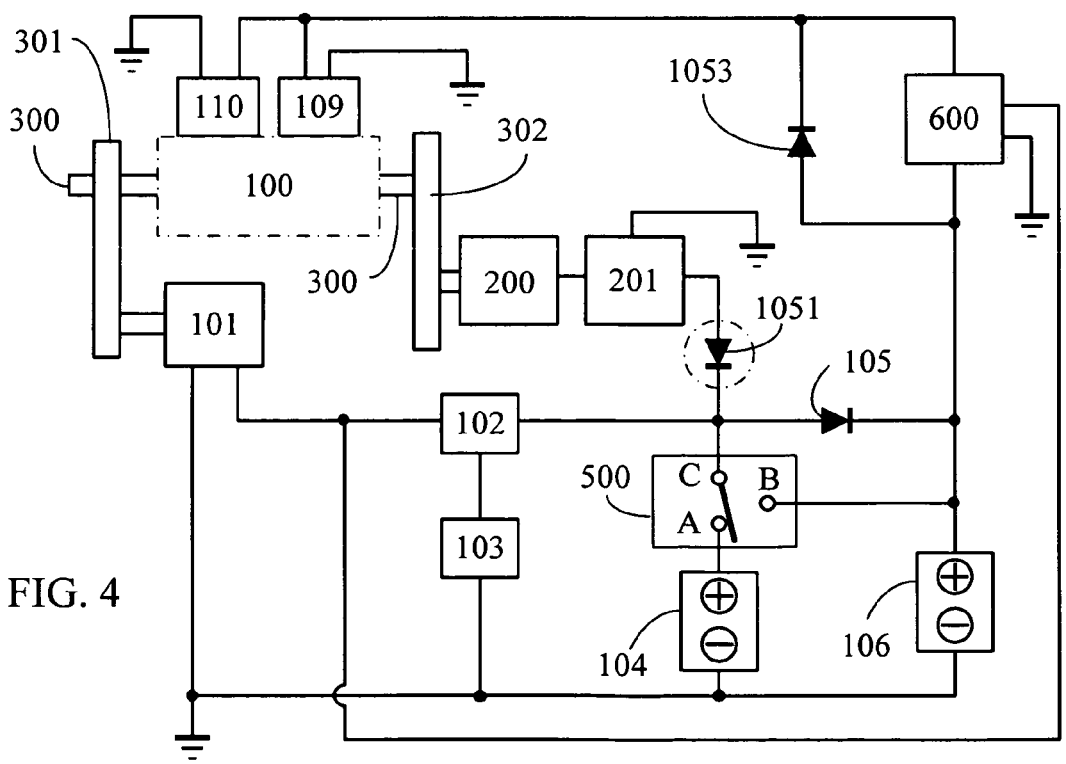
FIG. 4 is a circuit block diagram omitting a secondary charging and discharging auxiliary power storage device and isolation diode in FIG. 1

Moreover, the present invention of a combustion and emergency starting control system with auxiliary power is further configured as shown in the operational circuit block diagram FIG. 4 omitting the secondary charging and discharging auxiliary power storage device 107 and the isolation diode 108 in FIG. 1. i.e., the secondary charging and discharging auxiliary power storage device 107 and isolation diode 108 in FIG. 1 are omitted and not installed. Instead, isolation diode 105 is forward series installed between the starting battery 104 and the primary charging and discharging auxiliary power storage device 106 to become one way turn-on in order to restrict electric charging energy from the starting battery 104 to the primary charging and discharging auxiliary power storage device 106. The electric energy required by the engine ignition device 109 and the fuel injection device 110 is then supplied by the primary charging and discharging auxiliary power storage device 106. When the power of the starting battery 104 is insufficient, the electric energy of the primary charging and discharging auxiliary power storage device 106 is used to drive and start the motor and the engine by operating the emergency starting switching device 500.

Both or any one of the emergency starting switching device 500 and/or the direct current boosted boost circuit device 600 are installed which shall include:

Emergency starting switching device 500: Consists of three-terminal type solid state electronic switching device or mechanical switching device, and the common C terminal is the positive power terminal leading to the motor starting relay 102 and starting switch 103, and the normally closed A terminal is the positive terminal leading to the starting battery 104, and the normally opened B terminal which is switch able to closed during an emergency is the positive terminal leading to the primary charging and discharging auxiliary power storage device 106; when battery starting power is insufficient, operating the auxiliary switching device can enable the auxiliary battery electric energy to drive and start the motor which in turn will start the engine.

Direct current boosted boost device 600: Consists of solid state electronic circuit elements or electromechanical circuit elements installed at the positive power terminal of the secondary charging and discharging auxiliary power storage device 107 and between the power terminals of the engine ignition device 109 and the fuel injection device 110, and the direct current boosted boost circuit device 600 is started by the signal from relay 102 when the motor power is turned on to increase voltage in order to enable the engine ignition device 109 or the fuel injection 110 to run on a booster state advantageous to starting the engine, and the diode 1053 is connected in parallel between the power input terminal of the direct current boosted boost circuit device 600 and the higher homopolar voltage output terminal; when the direct current boosted boost circuit device 600 stops operating, electric energy from the power terminal are delivered through diode 1053 to the engine ignition device 109 and the fuel injection device 110.

Figure 5:
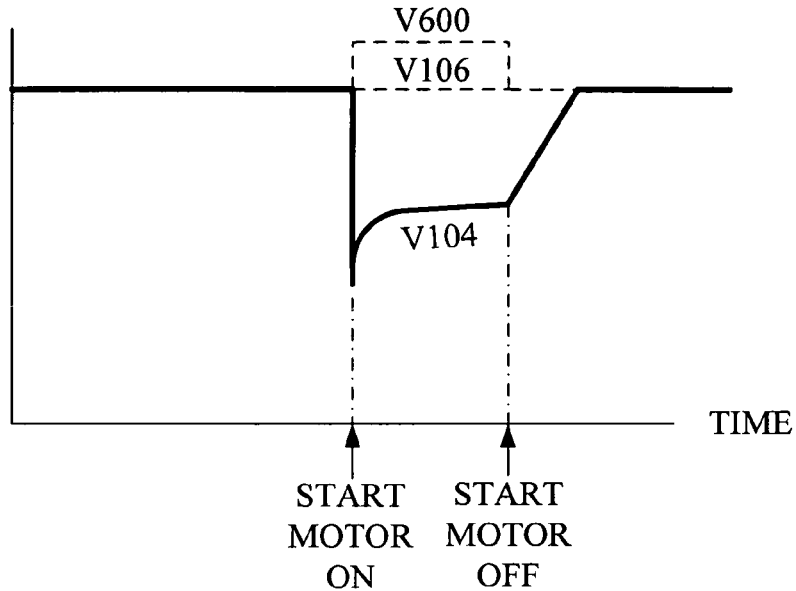
FIG. 5 is an operational diagram showing the variation of battery voltage and motor starting voltage in FIG. 4

FIG. 5 is an operational diagram showing the variation of the battery voltage and the motor start voltage in FIG. 4. As shown in FIG. 5, Voltage V106 is the terminal voltage of the primary charging and discharging auxiliary power storage device 106, and V104 is the terminal voltage of the starting motor 104, and V600 is the output voltage of the direct current boosted boost circuit device 600.

Figure 6:
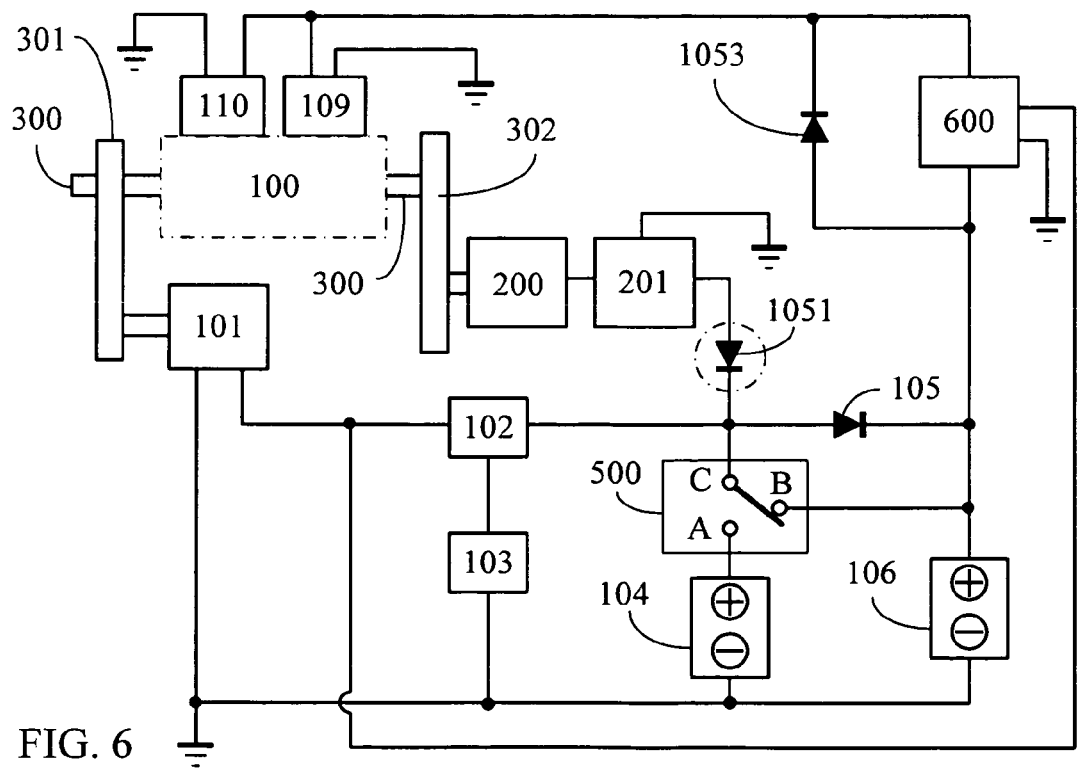
FIG. 6 is a circuit diagram of the auxiliary power electric energy starting the engine in FIG. 4

FIG. 6 is the circuit diagram of the auxiliary power electric energy starting the engine in FIG. 4.

As shown in FIG. 4, the engine ignition device 109, fuel injection device 110, starting battery 104, primary charging and discharging auxiliary power storage device 106, emergency starting switching device 500, generator 200, regulating device 201 and direct current boosted boost circuit device 600 are separately installed or combined by two or more of the aforementioned components.

Figure 7:
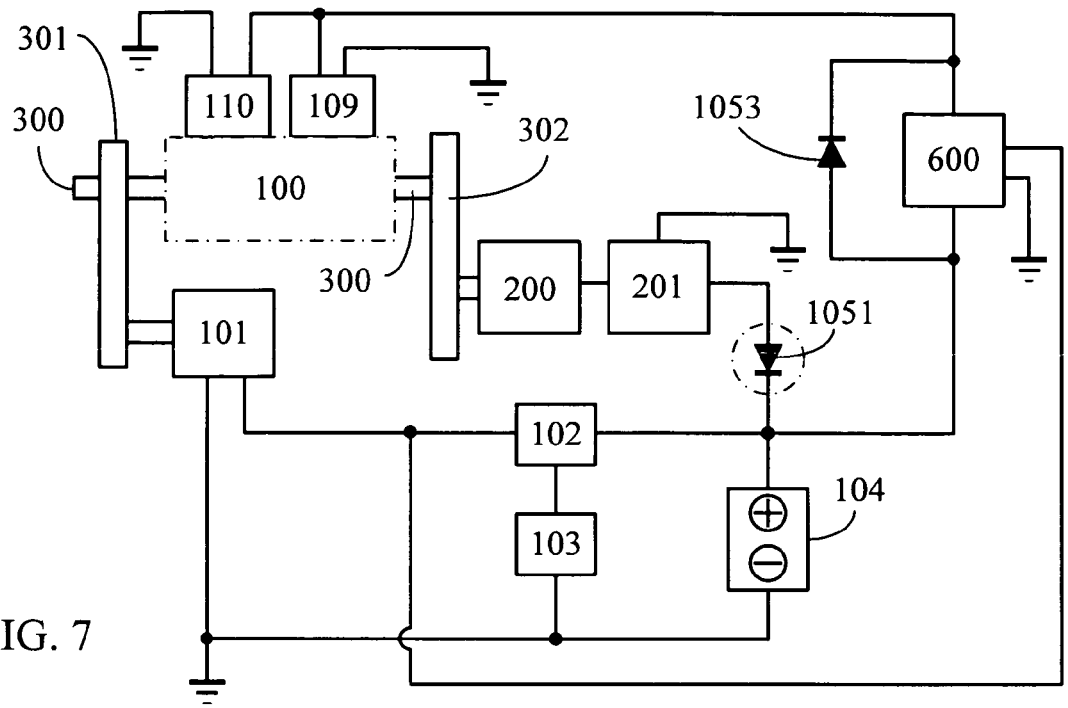
FIG. 7 is the circuit diagram of the direct current boosted boost circuit device of the present invention

FIG. 7 is the circuit diagram of the direct current boosted boost circuit device of the present invention.

Figure 8:
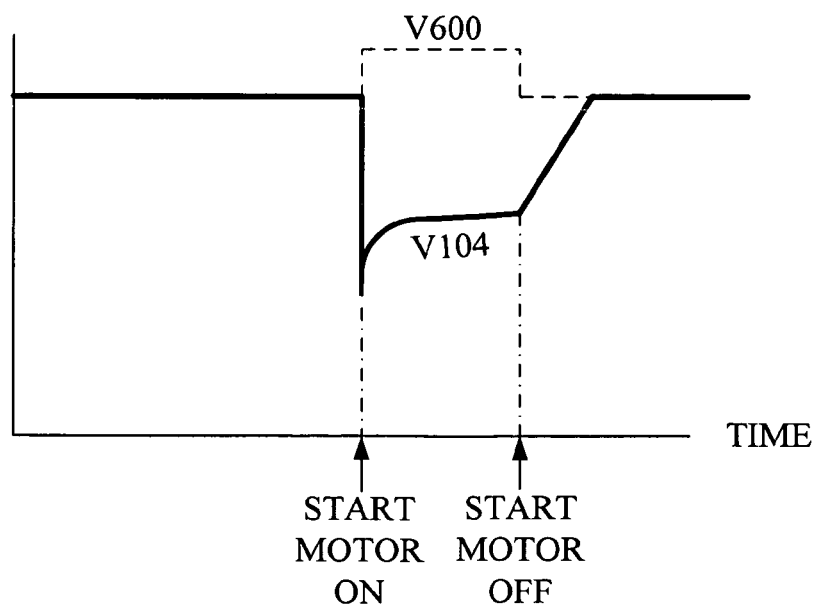
FIG. 8 is an operational diagram showing the variation of battery voltage and motor starting voltage in FIG. 7

FIG. 8 is an operational diagram showing the variation of the battery voltage and the motor start voltage in FIG. 7

As shown in FIG. 7, the secondary charging and discharging auxiliary power storage device 107, isolation diode 108, primary charging and discharging auxiliary power storage device 106, isolation diode 105, and the emergency starting switching device 500 in FIG. 1 are omitted and not installed. Instead, the starting battery 104 is allowed to directly charge the direct current boosted boost circuit device 600. The main components include:

Engine set 100: Consists of internal combustion engine using diesel, biodiesel, gasoline, natural gas or methanol as fuel;

Engine rotating shaft 300: Supply rotating kinetic energy engine output to drive loads, and to couple with the starting motor 101 by means of the transmission device 301, directly or by means of the transmission device 302 to couple with the generator set 200;

Starting motor 101: Consists of brush or brushless direct current or alternating current motors or generators with motor capability. By operating the motor start relay 102, the battery electric energy is controlled to drive the starting motor 101, directly or through the transmission device 301 affecting the generator set 100;

Starting switch 103: Consists of electromechanical switching elements or solid state electronic switching elements to supply and control power from starting battery 104 to the ignition device or the ignition device and/or the fuel injection device 110; and/or to supply power and control motor starting relay 102; or to directly supply power and control staring motor 101; and/or to supply power to other car electrical devices;

Starting battery 104: Consists of various charging and discharging secondary batteries or super capacitance to provide electric energy to the starting motor 101; and to accept electric energy generated by the generator 200 and external power charging.

Generator 200: Consists of alternating current or direct current generator and driven directly or indirectly through transmission device 302 by an engine to produce a relative alternating electric energy or a rectified direct current or to directly produce direct current electric energy output; when generator 200 and/or regulating device 201 are direct current generators and do not possess reverse current avoidance function, isolation is made according to the charging current direction from the generator winding 211 to the starting battery 104 through the regulating device 201 and by the forward series installation of diode 1051, and if generator 200 possesses reverse current avoidance function, then installing diode 1051 is unnecessary.

Regulating device 201: Consists of electromechanical or solid state electronic type circuit device. When generator 200 works as a direct current generator, the regulating device directly regulates the direct current electric energy and separately charges the starting battery 104, and/or to supply power to other loads. When generator 200 works as an alternating current generator, the alternating current must first be rectified into direct current and then passed through regulating device 201 before it can charge the starting battery 104, and/or to supply power to other loads.

Engine ignition device 109: Consists of electromechanical circuit elements or solid state electronic circuit elements or the combination of both elements to provide ignition to an internal combustion engine for running the engine;

Fuel injection device 110: Consists of a fuel injection structural device with throttle switching function to control injection width, and circuit control devices for operating fuel injection structural devices that are able to refer to throttle opening, oil temperature, air intake temperature, and oxygen-containing crankshaft signals (IP-ARB);

Any one or both of the engine ignition device 109 and the fuel injection device 110 are installed;

Direct current boosted boost device 600: Consists of solid state electronic circuit elements or electromechanical circuit elements and driven by the power of the starting battery 104, engine ignition device 109 and the fuel injection device 110, and the direct current boosted boost circuit device 600 is started by the signal from relay 102 when the motor power is turned on to increase voltage in order to enable the engine ignition device 109 or the fuel injection device 110 to run on a booster state advantageous to starting the engine, and the diode 1053 is connected in parallel between the power input terminal of the direct current boosted boost circuit device 600 and the higher homopolar voltage output terminal; when the direct current boosted boost circuit device 600 stops operating, electric energy from the power terminal are delivered through diode 1053 to the engine ignition device 109 and the fuel injection device 110.

FIG. 8 is the operational diagram showing the variation of the battery voltage and motor start voltage in FIG. 7. Voltage V106 in FIG. 8 is the terminal voltage of the primary charging and discharging auxiliary power storage device 106 while V600 is the output voltage of the boosted boost circuit device 600.

Engine ignition device 109, fuel injection device 110, starting battery 104, generator 200, regulating device 201, and direct current boosted boost circuit device 600 in FIG. 7 are separately installed or combined by two or more of the aforementioned components.

Figure 9:
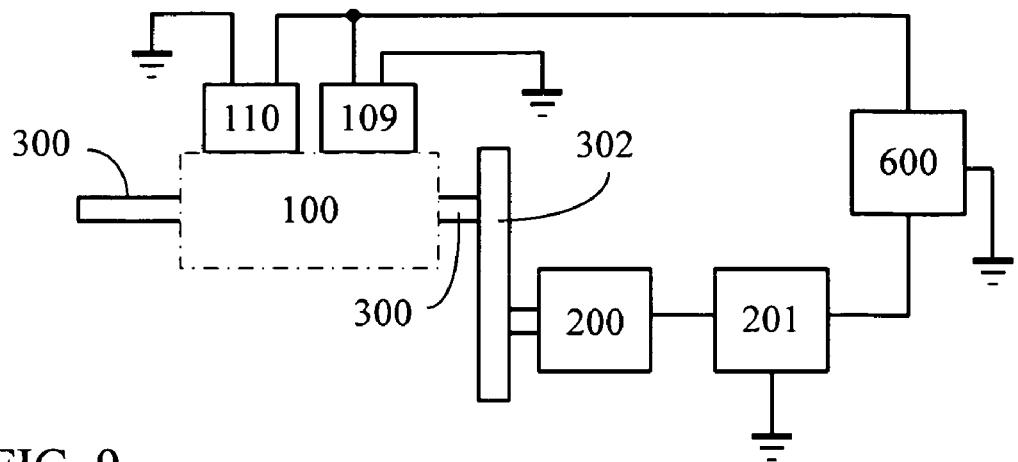
FIG. 9 is a circuit diagram formed by the application of the present invention on a manually started engine with the installation of a direct current boosted boost circuit device

If the engine in operational diagram FIG. 9 is manually started, and because it is not equipped with starting motor 101, starting battery 104 and isolation diode 105, power is supplied solely by the generator 200 winding and the regulating device 201. So when the manually started engine speed is relatively slow and the generator 200 voltage is low, the generated electric energy of the generator 200 is stepped up by means of the direct current boosted boost circuit device 600. And during normal operation, the generated electric energy is stepped down to normal voltage in order to improve the operation of the engine ignition device 109 and/or the fuel injection device 110. Methods for checking normal operation include:

(1) Check reference on engine speed signals;
(2) Refer to generator voltage;
(3) By setting the transfer to normal voltage when the step up start time expires.

FIG. 9 is the circuit diagram formed by the application of the present invention on a manually started engine with the installation of a direct current boosted boost circuit device.

Figure 10:
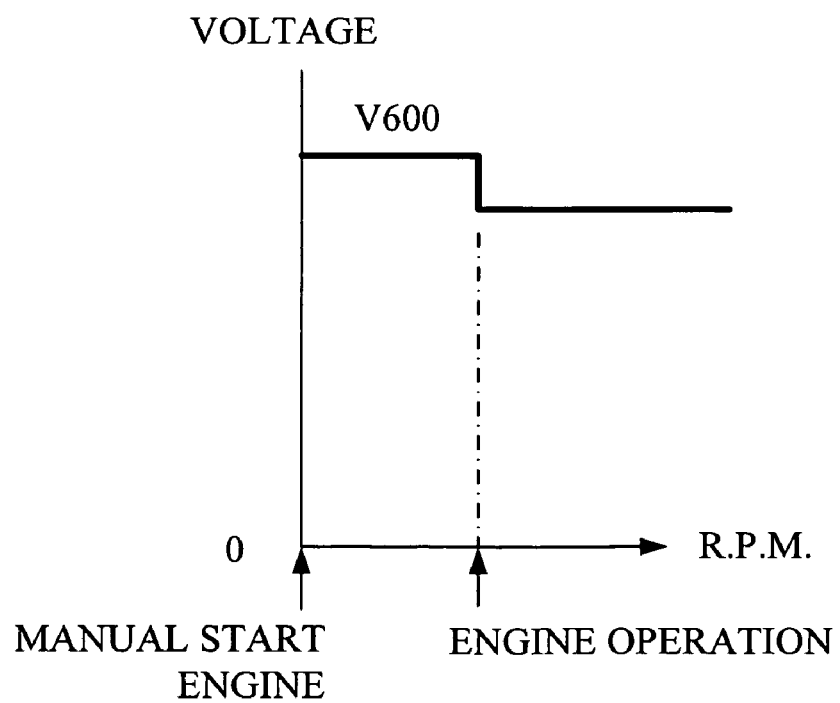
FIG. 10 is a schematic diagram showing the variation of the direct current boosted boost circuit device output voltage in FIG. 9

FIG. 10 is an operational diagram showing the variation of the direct current boosted boost circuit device output voltage in FIG. 9.

The ignition device 109, fuel injection device 110, generator 200, regulating device 201 and the direct current boosted boost circuit device 600 are separately installed or combined by two or more of the aforementioned components.

The invention claimed is:
1. A combustion and emergency starting control system comprising:
 a primary auxiliary power storage device having a charging and discharging battery that exclusively supplies required electric energy to an ignition device or a fuel injection device as well as for emergency starts;

a primary isolation diode that is installed between a starting battery and the auxiliary power storage device, wherein the primary isolation diode isolates the battery power for starting a motor in order to prevent the sudden drop of the voltage to the ignition device or the fuel injection device, which can hinder normal engine start due to the substantial drop of battery voltage as a result of the greater current required in starting the motor when the engine is started, while maintaining excellent ignition, wherein the primary isolation diode becomes a one way turn-on for a starting battery current to charge the primary auxiliary power storage device and prevents reverse discharging to the starting battery;

an emergency starting switch device switchable to enable the primary auxiliary battery electric energy to drive and start the motor which in turn will start the engine; and a direct current boosted boost circuit device connected at a positive power terminal of the discharging auxiliary primary power storage device and between power terminals of the engine ignition device and the fuel injection device so that when the starting battery has insufficient power during starting, the electric energy of the auxiliary battery can drive the starting motor in order to start the engine by operating the emergency starting switching device and that the voltage boost of the direct current boosted boost circuit device will enable the ignition device or the fuel injection device to step up voltage in order to strengthen its starting capability when the motor is started to start the engine.

2. A combustion and emergency starting control system as claimed in claim 1, further comprising:

an engine set comprising an internal combustion engine using diesel, biodiesel, gasoline, natural gas or methanol as fuel and equipped with a starting motor;

an engine rotating shaft that supplies rotating kinetic energy engine output to drive loads, coupled to at least two transmission devices, wherein at least one transmission device is coupled to the starting motor and the other transmission device is coupled with a generator set;

a starting motor comprising brush or brushless direct current or alternating current motors or generators with motor capability, wherein a motor start relay controls the battery electric energy to drive the starting motor through the transmission device affecting the generator set;

a starting switch comprising electromechanical switching elements or solid state electronic switching elements to supply and control power from a starting battery to the ignition device, the fuel injection device; or to the motor starting relay; or directly supply power and control to the starting motor; or to supply power to other car electrical devices;

a secondary charging and discharging auxiliary power storage device comprising a secondary charging and discharging battery or super capacitance to store electrical energy from the primary charging and discharging auxiliary power storage device in order to supply instant electric energy to the engine ignition device during engine ignition;

a secondary isolation diode located between the primary charging and discharging auxiliary power storage device and the secondary charging and discharging auxiliary power storage device, and the current direction from the primary charging and discharging auxiliary power storage device to the secondary charging and discharging auxiliary power storage device is in series with the secondary isolation diode in order to prevent reverse discharge by the secondary charging and discharging auxiliary power storage device on the primary charging and discharging auxiliary power storage device when using the primary charging and discharging auxiliary power storage device as the power source in starting the motor in an emergency while operating the emergency starting switching device;

a generator comprising alternating current or direct current generator and driven directly or indirectly through transmission device by an engine to produce a relative alternating electric energy or a rectified direct current or to directly produce direct current electric energy output, wherein when generator or regulating device are direct current generators and do not possess reverse current avoidance functions, isolation is made according to the charging current direction from a generator winding to the starting battery through the regulating device and by a forward series installation diode, however if generator possesses reverse current avoidance function, then installing forward series installation diode is unnecessary;

a regulating device comprising electromechanical or solid state electronic type circuit device, wherein when the generator works as a direct current generator, the regulating device directly regulates the direct current electric energy and separately charges the starting battery, or the primary charging and discharging auxiliary power storage device, or the secondary charging and discharging auxiliary power storage device, or supplies power to other loads, however when the generator works as an alternating current generator, the alternating current must first be rectified into direct current and then passed through a regulating device before it can charge the starting battery, or the primary charging and discharging auxiliary power storage device, or the secondary charging and discharging auxiliary power storage device, or supplies power to other loads, wherein the fuel injection device comprises a fuel injection structural device with throttle switching function to control injection width, and circuit control devices for operating fuel injection structural devices that are able to refer to throttle opening, oil temperature, air intake temperature, and oxygen-containing crankshaft signals (IP-ARB)

wherein the emergency starting switching device comprises three-terminal type solid state electronic switching device or mechanical switching device, and the common C terminal is the positive power terminal leading to the motor starting relay and starting switch, and the normally closed A terminal is the positive terminal leading to the starting battery, and the normally opened B terminal which is switch able to closed during an emergency is the positive terminal leading to the primary charging and discharging auxiliary power storage device;

wherein the direct current boosted boost device comprises solid state electronic circuit elements or electromechanical circuit elements installed between power mains of the secondary charging and discharging auxiliary power storage device and the power mains of the engine ignition device and the fuel injection device, and direct current boosted boost circuit device is started by the signal from the motor starting relay when the motor power is turned on to increase voltage in order to enable the engine ignition device or the fuel injection device to run on a booster state advantageous to starting the engine, and a bypass around the boosted boost circuit device diode is connected in parallel between the power input terminal of the direct current boosted boost circuit device and the higher homopolar voltage output terminal wherein when the direct current boosted boost circuit device stops operating, electric energy from the power terminal are delivered through the bypass around the boosted boost circuit diode to the engine ignition device and the fuel injection device, wherein the starting battery comprises various charging and discharging secondary batteries or super capacitance to provide electric energy to the starting motor, and to accept power charging from the generated electric energy of the generator and external sources, wherein the engine ignition device comprises electromechanical circuit elements or solid state electronic circuit elements or the combination of both elements to provide ignition to an internal combustion engine for running the engine, and wherein the primary auxiliary power storage device comprises various charging and discharging batteries or super capacitance to store electric energy from the starting motor, built-in generator or from other external charging devices.

3. A combustion and emergency starting control system as claimed in claim 2, wherein the engine ignition device, fuel injection device, starting battery, isolation diode, primary charging and discharging auxiliary power storage device, isolation diode, secondary charging and discharging auxiliary power storage device, emergency starting switching device, generator, regulating device and direct current boosted boost circuit device are separately installed or combined by two or more of the aforementioned components.

4. A combustion and emergency starting control system as claimed in claim 2, wherein the primary isolation diode is forward series installed between the starting battery and the primary charging and discharging auxiliary power storage device to become one way turn-on in order to restrict electric charging energy from the starting battery to the primary charging and discharging auxiliary power storage device, wherein the electric energy required by the engine ignition device and the fuel injection device is supplied by the primary charging and discharging auxiliary power storage device and when the power of the starting battery is insufficient, the electric energy of the primary charging and discharging auxiliary power storage device is used to drive and start the motor, and in turn, start the engine by operating the emergency starting switching device.

5. A combustion and emergency starting control system with auxiliary power as claimed in claim 4, wherein the ignition device, fuel injection device, starting battery, primary charging and discharging auxiliary power storage device, emergency starting switching device, generator, regulating device and direct current boosted boost circuit device are separately installed or combined by two or more of the aforementioned components.

\* \* \* \* \*